United States Patent
Nagai et al.

(10) Patent No.: US 6,246,616 B1
(45) Date of Patent: *Jun. 12, 2001

(54) MEMORY DEVICE HAVING REDUNDANCY CELLS

(75) Inventors: Eiichi Nagai; Chikai Ono, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/487,878

(22) Filed: Jan. 20, 2000

(30) Foreign Application Priority Data

Jan. 21, 1999 (JP) .................................................. 11-013613

(51) Int. Cl.[7] .............................. G11C 7/00; G11C 11/22
(52) U.S. Cl. ........................................... 365/200; 365/145
(58) Field of Search ..................................... 365/200, 145, 365/149

(56) References Cited

U.S. PATENT DOCUMENTS 5,726,930 * 3/1998 Hasegawa et al. .................. 365/145
5,959,878 * 9/1999 Kamp .................................... 365/145

FOREIGN PATENT DOCUMENTS 9-128991   5/1997   (JP) .

* cited by examiner

Primary Examiner—Trong Phan
(74) Attorney, Agent, or Firm—Arent Fox Kintner Plotkin & Kahn, PLLC

(57) ABSTRACT

The present invention relates to a memory device, such as a FeRAM, of which redundancy structure is simplified. In the present invention, a redundancy file memory for recording a replacing information indicating the defective cell to be replaced into a redundancy cell is formed by a memory cell having the same structure as a normal memory cell, so that it is capable to access to a redundancy file memory at the same time when accessing to a normal memory cell. Then, the replacing information recorded in the redundancy file memory is concurrently read out when accessing to the normal memory cell, and the defective cell is replaced into a redundancy cell according to the replacing information.

13 Claims, 15 Drawing Sheets

STRUCTURE OF MEMORY CELL

CHARACTERISTIC OF FERROELECTRIC FILM

Waveform Chart of FeRAM at Reading Mode

Structure of Memory Cell

Waveform Chart of FeRAM at Reading Mode

Column of FeRAM

First Embodiment (Left-half Portion)

First Embodiment(Right-half Portion)

Second Embodiment (Left-half Portion)

Second Embodiment(Right-half Portion)

Third Embodiment(Left-half Portion)

Third Embodiment(Right-half Portion)

Fourth Embodiment(Left-half Portion)

Real Cell(512×8×8)

Fourth Embodiment (Right-half Portion)

Fifth Embodiment (Left-half Portion)

Fifth Embodiment (Right-half Portion)

MEMORY DEVICE HAVING REDUNDANCY CELLS

BACKGROUND OF THE INVENTION

1. Field of the Invention

The present invention relates to a memory device where a redundancy cell is included in. More particularly, it relates to a memory device in which a structure of the redundancy file for recording information of replacing to a redundancy cell is formed as the same as that of a normal cell, for example, a defective cell can be replaced into a redundancy cell not only at a wafer stage, but also even after a chip is stored in a package.

2. Description of the Related Art

A memory device, which uses a semiconductor, has a redundancy cell for relieving a defective cell as memory capacity increases. A DRAM used as a cache memory of a computer has a redundancy cell, and stores address information of the defective cell replaced into the redundancy cells in a fuse ROM (redundancy ROM). Then, the DRAM compares a supplied address with the address stored in the redundancy ROM, inhibits an access to a normal cell and permits to access to the redundancy cell, when both addresses are coincident.

On the other hand, a ferroelectric memory using residual polarizing action of a ferroelectric material, which is one of memory devices using a semiconductor therein, has become of major interest lately as a faster rewritable non-volatile memory as the same as a DRAM. The memory cell of FeRAM has also a simple structure formed by a selection transistor and a capacitor as the same as that of the memory cell of DRAM, and therefore, there is quite a possibility to give a large memory capacity in future. As above-described, a dielectric layer of the capacitor is made by a ferroelectric material, which is polarized by applying an electric field of one direction between electrodes of the capacitor so that residual polarization retains, even after the electric field disappears, and data is recorded. Specifically, the FeRAM is a non-volatile memory where stored data can be retained even when the power is not supplied. Moreover, it is expected that the FeRAM can be used as a non-volatile memory having a large memory capacity instead of a DRAM, because the time required for rewriting or erasing data is shorter than that of EEPROM or flash memory widely used nowadays.

Development of the FeRAM has just started, so that a device having such a large memory capacity has not been developed now. Therefore, there is no suggestion relating to a redundancy cell and the structure of replacing a defective cell into the redundancy cell. However, it can be easily estimated that the redundancy cell structure becomes a requisite structure as memory capacity increases in future, and therefore, it is required to suggest the redundancy cell and the replacing structure.

The different point between the FeRAM and the DRAM or the like will be now explained as follows. Firstly, the manufacturing process is not developed so maturely that the redundancy cell structure must be as simple circuitry structure as possible. Secondly, the defective cell detection at the FeRAM occurs not only at a wafer examination but also at a burn-in test (an acceleration test) after a memory chip is encapsulated in a package, and therefore, the defective cell must be replaceable into a redundancy cell even after encapsulating a chip into a package.

Accordingly, if a fused ROM employed in a DRAM, cut by a laser, is used as a redundancy ROM, it is required to form a memory having a different structure from an ordinary cell as a redundancy ROM in a chip. Additionally, the defective cell can be relieved only at a wafer stage, and therefore, the defective cell can not be relieved after storing a chip in a package.

Further, even DRAM, the defective cell detected after storing a chip in a package can not be relieved as long as the redundancy ROM is formed by the currently used fused ROM. Further, in a normal DRAM, it is general that a column including the defective cell is replaced into a redundancy column. In the replacing method, when some defective cells are diversely generated in a chip, there is a limit to the numbers of replaceable redundancy columns, thus that prevents from relieving the defective cells. Therefore, the relieving probability is limited.

SUMMARY OF THE INVENTION

Accordingly, it is an object of the present invention to provide a memory device, by which a redundancy cell and a redundancy file memory for recording information of replacing to the redundancy cell can be realized in a simple structure.

It is another object of the present invention to provide a memory device, in which a defective cell can be replaced into a redundancy cell, even after storing a memory chip in a package.

It is further object of the present invention to provide a memory device, by which a probability of relieving a redundancy cell can be increased.

It is furthermore object of the present invention to provide a FeRAM, in which a redundancy cell and a redundancy file memory for recording information of replacing into a redundancy cell can be realized in a simple structure.

It is another object of the present invention to provide a FeRAM, in which a defective cell can be replaced into a redundancy cell, even after storing a memory chip in a package.

It is still other object of the present invention to provide a FeRAM, by which a probability of relieving a redundancy cell can be increased.

To achieve the above described objects, in the present invention, a redundancy file memory for recording a replacing information indicating the defective cell to be replaced into a redundancy cell is formed by a memory cell having the same structure as a normal memory cell, so that it is capable to access to a redundancy file memory at the same time when accessing to a normal memory cell. Then, the replacing information recorded in the redundancy file memory is concurrently read out when accessing to the normal memory cell, and the defective cell is replaced into a redundancy cell according to the replacing information.

With this structure, the structure of the redundancy file memory can be the same as the normal memory cell and the redundancy cell, thus the redundancy circuit structure can be simplified. Additionally, since data can be written in the redundancy file memory, in the same manner of the normal memory cell, it becomes possible to replace the defective cell into a redundancy cell and to record the replacing information, even after storing a memory chip in a package. In other words, even after storing the chip in a package, the defective cell can be relieved. In addition, since the replacing information indicating the defective cell is recorded in a redundancy file memory, it is possible to change the replacing information in each word line, therefore, it also becomes possible to replace the defective cell into a redundancy cell for each defective cell. Therefore, a probability of relieving defective cells with this structure can be increased higher than that when the defective cell is replaced into a redundancy cell in each column or each word.

To achieve the above-described objects, in the present invention, a memory device having a normal memory area and a redundancy memory area, in which a defective cell in the normal memory area can be rewritten into a redundancy cell in the redundancy memory area, includes:

a redundancy file memory, having cells, each of which structure is the same as that in the normal memory area and the redundancy memory area, for recording a replacing information for the cell accessed in the normal memory area, and outputting a signal of the replacing information by being accessed at the same time the normal memory area is accessed, and a selecting circuit for inhibiting selection of the normal memory area and permitting selection of the redundancy memory area, in response to the signal of the replacing information corresponding to the defective cell.

According to the above invention, since the structure of a redundancy file memory recording the replacing information can be the same as the normal memory cell, there is no need to provide a special extra ROM for redundancy file memory, thus the structure can be simplified. In addition, even after storing a memory chip in a package, it becomes possible to replace the defective cell into the redundancy cell and to write the replacing information into the redundancy file memory.

To achieve the above-described objects, a memory device according to the present invention, in which a defective cell in a normal memory area can be replaced into a redundancy cell in a redundancy memory area includes:

a memory area having plural word lines, plural bit lines and plural cells located at cross points between the word lines and the bit lines, wherein the memory area includes the normal memory area, the redundancy memory area and a redundancy file memory area for recording a replacing information of the defective cell, the replacing information of the defective cell connected to a word line is recorded in a cell of the redundancy file memory area connected to the corresponding word line, and the replacing information is output from the redundancy file memory area, in response to the selection of the corresponding word line, and a selecting circuit for inhibiting a selection of the normal memory area and permitting a selection of the redundancy memory area, in response to the replacing information.

According to the above invention, since the structure of the redundancy file memory for recording the replacing information can be the same as a normal memory cell, there is no need to provide a special extra redundancy file memory ROM, thus the structure can be simplified. Even after storing a memory chip into a package, it is possible to replace the defective cell into the redundancy cell and to rewrite the replacing information into the redundancy ROM.

In the present invention, the normal memory area includes plural columns for each replacement, and the redundancy file memory, which is provided corresponding to the plural columns, includes plural cells along the word line for recording the replacing information that indicates whether the cell is replaced or not, and the selecting circuit, in response to the replacing information signal provided from the plural cells according to the word line drive, inhibits the selection of the corresponding column and permits the selection of the column of the redundancy memory area.

In addition, in the present invention, the normal memory area includes plural columns for each replacement, the redundancy file memory area includes plural cells along the word line for recording the replacing information relating to an address of column to be replaced from the plural columns, and the selecting circuit inhibits the selection of the column corresponding to the supplied address and permits the selection of the column in the redundancy memory, when the replacing information signal provided from the plural cells according to the drive of the word line is coincident with the supplied address for the plural columns.

BRIEF DESCRIPTION OF THE PRESENT INVENTION

DESCRIPTION OF THE PREFERRED EMBODIMENTS

Hereinafter, preferred embodiments of the present invention are described with reference to the drawings. However, the technical scope of the present invention is not limited to these embodiments.

Although the present invention is not restrictive to a FeRAM using a ferroelectric layer, it is applied to the other memory devices, however, the following embodiments will be explained with a FeRAM as one example.

Figure 1:
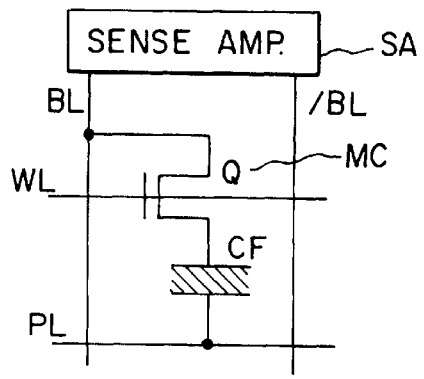
FIG. 1 is a diagram showing a memory cell structure of a FeRAM according to the present invention.

FIG. 1 is a diagram showing a structure of the memory cell formed by a FeRAM according to the embodiment. A memory cell MC formed by a FeRAM is composed of a transistor Q for selection, which is connected to a word line WL and a bit line BL, and a capacitor CF for storage having a ferroelectric film. The capacitor CF has one electrode connected to the transistor Q and the other electrode connected to a plate line PL. The bit line BL connected to the transistor Q and a bit line/BL on the opposite side are connected to a sense amplifier SA, each other.

Figure 2:
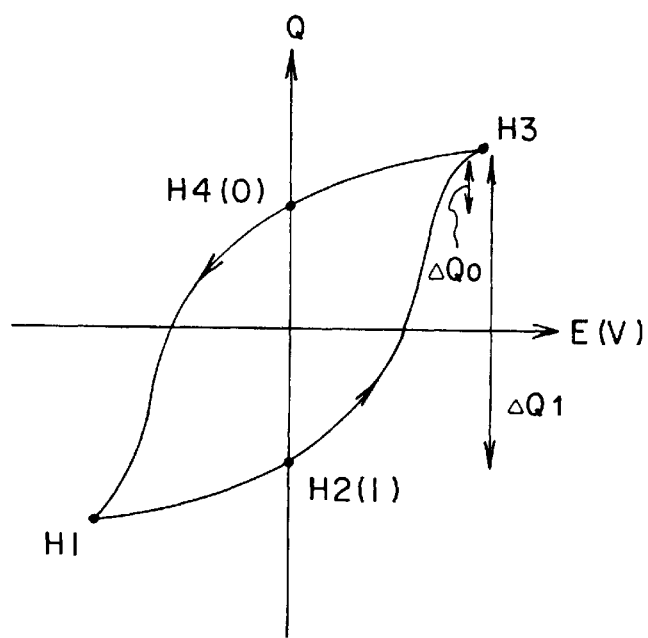
FIG. 2 is a hysteresis characteristic diagram of a ferroelectric film.

FIG. 2 is a hysteresis characteristic chart of the ferroelectric film. In FIG. 2, the vertical axis shows an electric field (voltage) applied to a ferroelectric film and the horizontal axis shows a charge Q according to a polarizing action. As shown in FIG. 2, when applying a positive electric field to the ferroelectric film from a state of point H2, a polarizing direction is changed along a direction of an arrow and the state is changed to a state of point H3. After the electric field application is stopped, the residual polarization is retained at a state of point H4. In addition, when applying a negative electric field to the ferroelectric film from the state of point H4, a polarizing direction is changed along a direction of an arrow and the state is changed to a state of the point H1. After the electric field application is stopped, the residual polarization is retained at a state of the point H2. Therefore, the point H2 at a data "1" state and the point H4 at a data "0" state make it possible to record binary data.

With the above-described principle, the data is written to the memory cell MC of FIG. 1 as follows: the bit line BL is set to H level, the plate line PL is set to H level, and the word line WL is set to H level to conduct the transistor Q, the electric field in the first direction is applied to the ferroelectric film of the capacitor CF so that it becomes in the state of the point H1, for example. After that, even if the word line WL is in L level and the transistor Q is made to non-conductive, and the electric field of the ferroelectric film is lost, the ferroelectric film keeps the polarized state where data "1" of the state H2 is recorded. Further, when the bit line BL is set to L level, the plate line PL is set to H level, the word line is set to H level, and the reversed electric field in the second direction is applied, and after then, the word line is set to L level, the ferroelectric film keeps the polarized state where data "1" of the state H4 is recorded.

Figure 3:
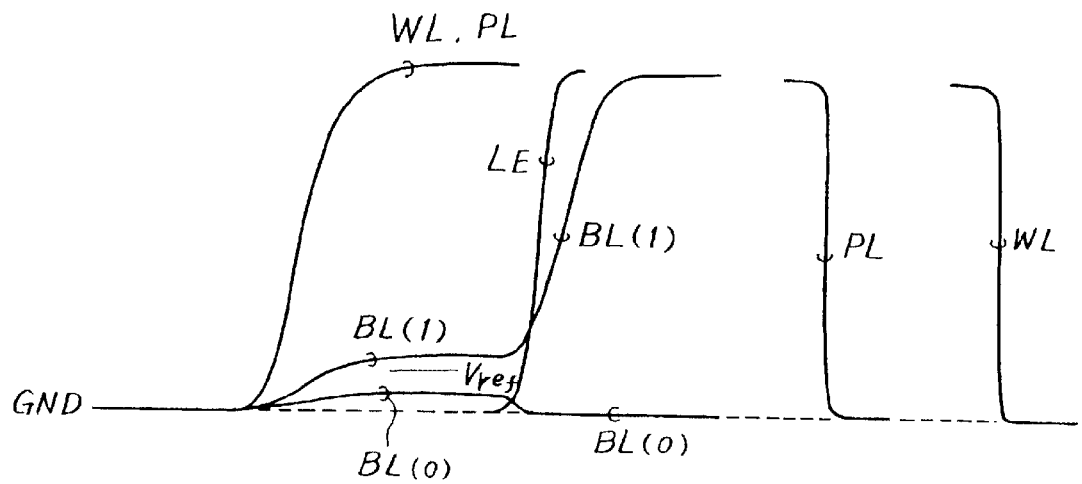
FIG. 3 shows a waveform chart of the FeRAM at reading mode.

FIG. 3 shows a waveform chart of the FeRAM at reading mode. The memory cell MC shown in FIG. 1 can be read out by resetting the bit line BL to L level (grand level), the word line WL to H level, and the plate line PL to H level. After the plate line PL is H level, electric field at the time of writing the above-described data "0" is applied to the ferroelectric film of the capacitor CF, and the film becomes in the state H3 of FIG. 2. As the result, when the data "1" is recorded, the state H2 is changed to the state H3, and large a charge ΔQ1 is flowed out to the bit line BL. When the data "0" is recorded, the film changes from the state H4 to the state H3, and a smaller charge ΔQ0 is flowed out to the bit line BL. Therefore, the level of the bit line BL rises largely (data "1") or rises smaller (data "0"). The sense amplifier SA detects the changed level by a comparison with a reference voltage Vref.

Since the FeRAM is destructively read as described above, the plate line PL is pulled down to L level after the level of the bit line BL is sufficiently amplified to H or L level, and the electric field in a writing mode corresponding to each detected data is applied to the ferroelectric film. After that, each data is returned to the stored state by pulling the word line WL down, and then, the rewriting operation is finished here.

Figure 4:
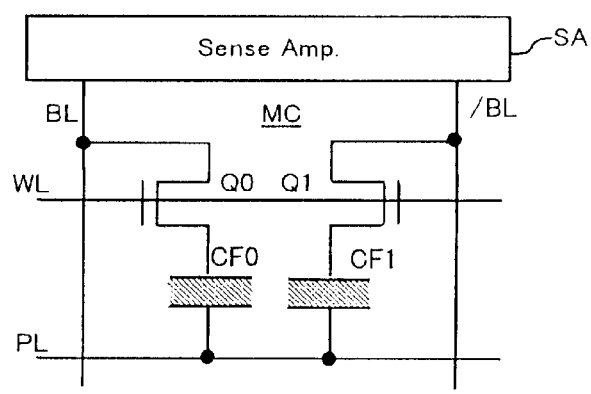
FIG. 4 shows a diagram showing the other structural example of a memory cell in the FeRAM.

FIG. 4 shows the other structural example of the memory cell in the FeRAM. The memory cell MC in this example, which is formed by one pair of the cells shown in FIG. 1, is composed of two transistors and two capacitors. Using this type memory cell MC makes it easy to detect data by using a differential voltage between one pair of bit lines at the reading mode by writing data reversed each other to one pair of capacitors CF0 and CF1.

Figure 5:
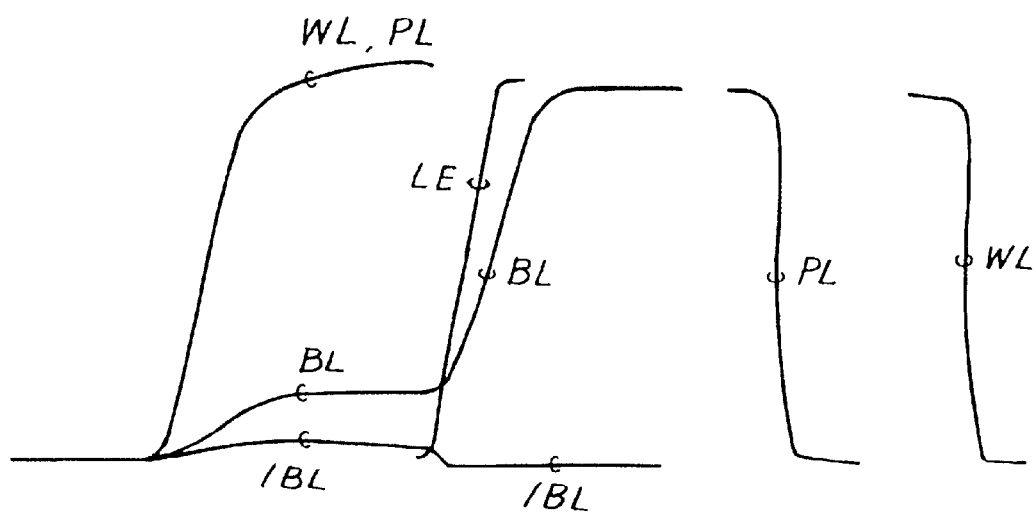
FIG. 5 shows a waveform chart of the FeRAM at reading mode.

FIG. 5 shows a waveform chart at a reading mode of the memory cell of FIG. 4. After both bit lines BL and /BL are reset to L level at the reading mode, the word line WL is risen to H level and the plate line PL is also driven to H level. Thereby, similarly to the case of FIG. 3, while the level of the bit line BL on the capacitor CF0, which stores data "1", largely rises, the level of the bit line BL on the capacitor CF1, which stores data "0" slightly rises. The sense amplifier SA detects the potential difference of these bit lines and amplifies it. The rewriting operation after that is as the same as the above-described case.

Figure 6:
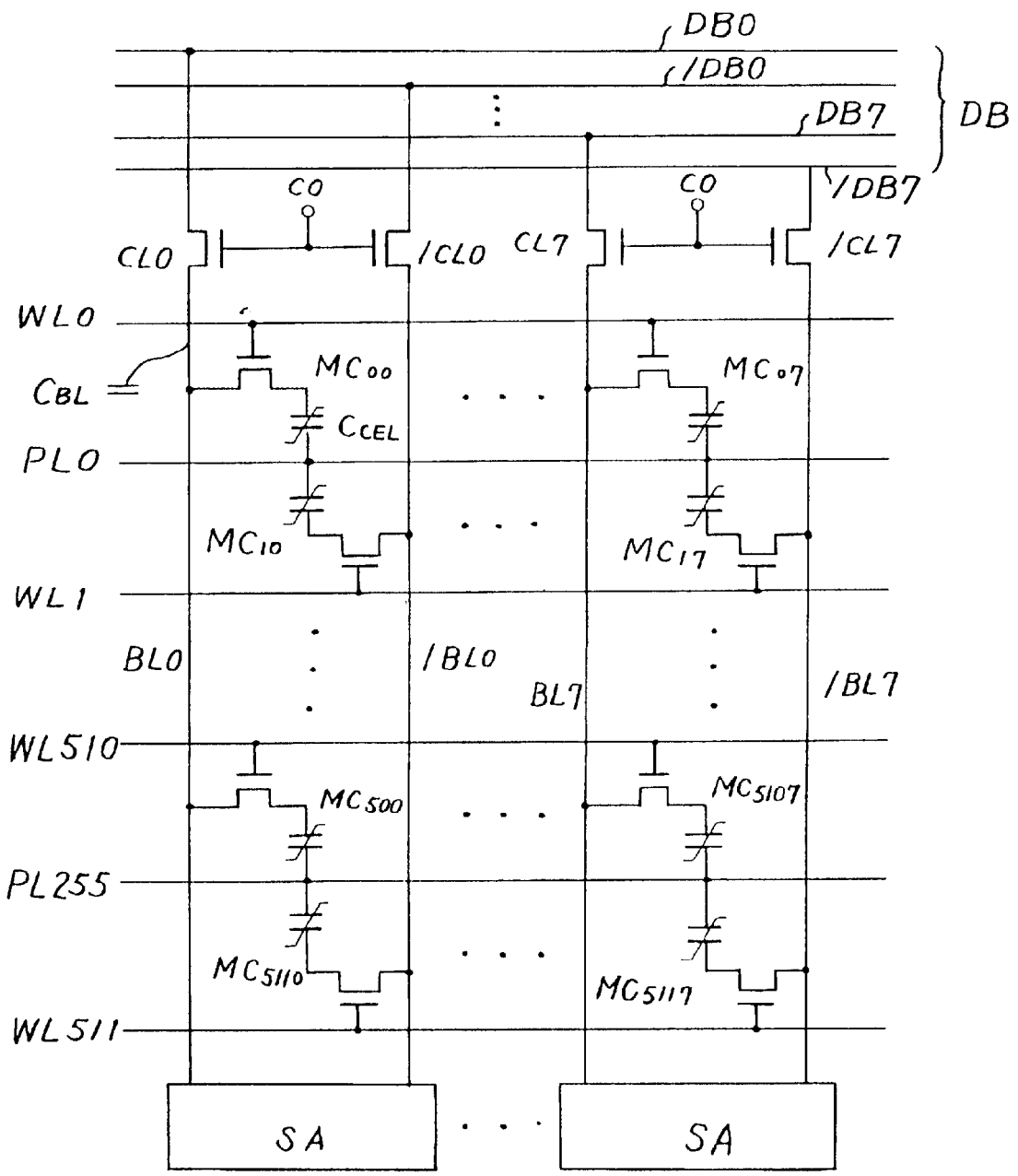
FIG. 6 is a diagram showing a structural example of a column in a memory area of the FeRAM.

FIG. 6 shows a structural example of a column in a memory area of the FeRAM. The column includes 8 pairs of bit lines, BL0, /BL0 to BL7, /BL7 and plural word lines WL0 to WL511. The 8 bit line pairs are concurrently connected to 8 data bus line pairs DB0, /DB0 to DB7, /DB7 through the column gates CL0, /CL0 to CL7, /CL7, each of which concurrently is conducted by each column selection signal C0. Each memory cell MC is positioned at an intersection between the bit and word lines. One pair of the even and odd word lines WL0, WL1 shares the plate line PL0. Therefore, when the even word line WL0 is selected, the read data is output to the bit line BL0 and is further output to the data bus line DB0. Additionally, when the odd word line WL1 is selected, the read data is output to the bit line/BL0 and is further output to the data bus line/DB0. This means that one output of the data bus line pairs becomes available according to the driven word line is odd or even.

As is described above, columns of the FeRAM have a structure where 8 bit line pairs BL are concurrently connected to eight data bus line pairs DB. Therefore, when any defective cells exist in a column, the entire column is replaced into a column in a redundancy memory area.

To optimally execute the FeRAM reading operation, it is necessary to make the bit line length of the FeRAM be longer to a certain extent and to make the parasitic capacity $C_{BL}$ thereof be larger to a certain extent. As described above, the data is read out by setting the bit line BL to a floating state, driving the plate line PL from L level to H level, applying the electric field to the capacitor $C_{CEL}$ of the cell, and using the principle shown in FIG. 2 to read the information. As the capacitor $C_{CEL}$ in each cell is connected to the bit lines BL, /BL through a cell transistor, the electric field accompanied by driving the plate line PL can not be effectively applied to the cell capacitor $C_{CEL}$, unless the parasitic capacity $C_{BL}$ of the bit line is increased to a certain extent. For this reason, it is normal to make a structure where the bit line length is relatively longer and the number of the word lines is relatively larger in the FeRAM.

Therefore, in a normal FeRAM including plural columns of FIG. 6, these columns are selected by decoding the column address. At the result of making the bit line length be relatively longer, the numbers of columns become relatively smaller, and the word or plate line length becomes relatively shorter. The bit line length is relatively longer and the word line length relatively shorter so that a possibility of generating plural defective cells tends to be higher in a bit line direction than in a word line direction. Accordingly, it is desired to relieve the plural detective cells placed along the bit line direction in the memory device formed by the FeRAM.

Figure 7:
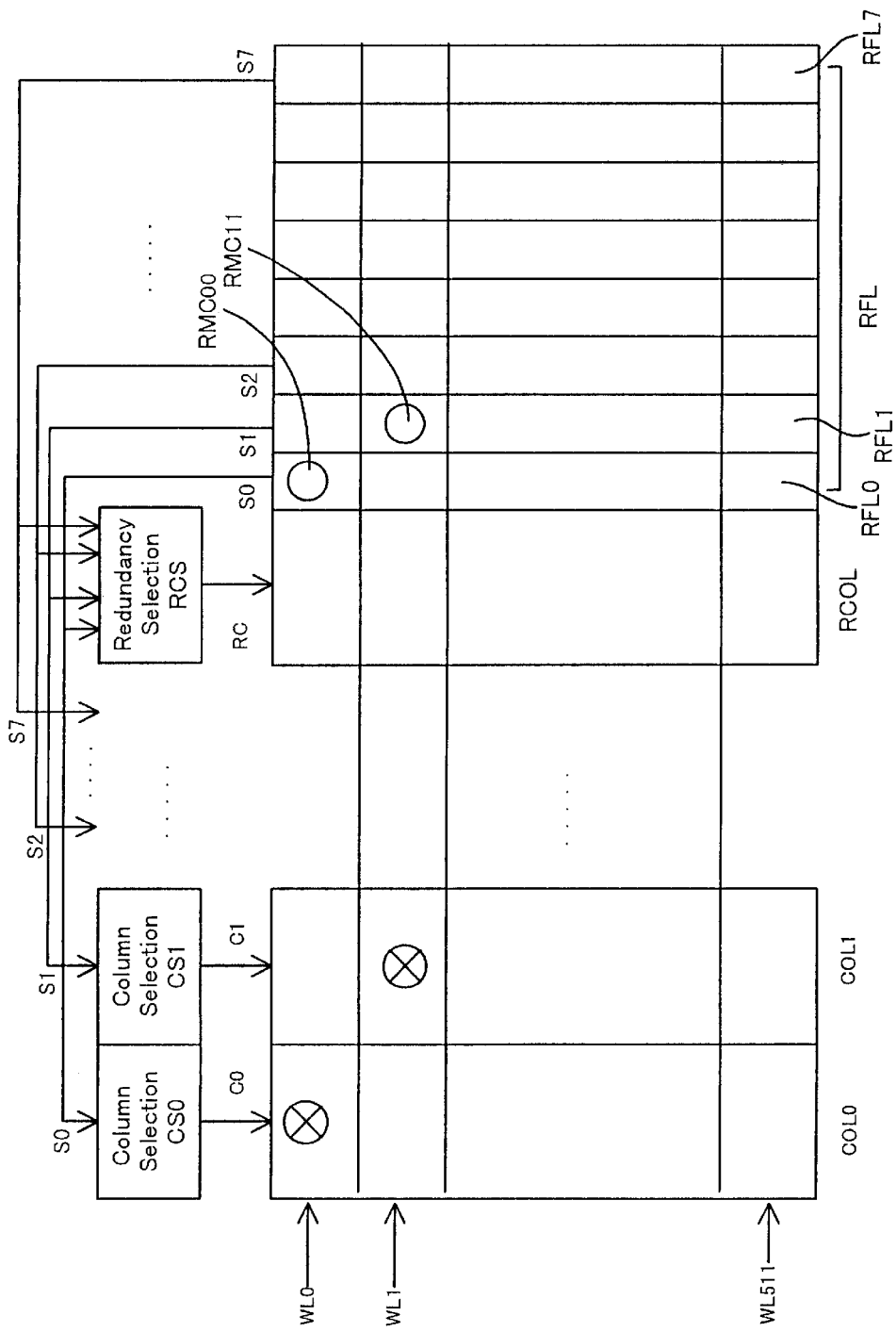
FIG. 7 is an entire structural diagram of a memory device having a redundancy cell.

FIG. 7 shows an entire structural diagram of the memory device having a redundancy cell. In the memory device of FIG. 7, eight columns COL0 to COL7 are provided in a normal memory area and a redundancy column RCOL for one column to relieve defective cells in the normal memory area is provided. The redundancy file memory RFL for recording information of replacing the defective cell into a redundancy cell also has a capacity for one column composed by 8 bit line pairs.

In the example of FIG. 7, the replacing information is recorded in the redundancy file memory RFL. With respect to the word line WL0, if one of the memory cells connected to the word lines WL0 in a column COL0 is a defective cell, when the word line WL0 is selected, the redundancy column RCOL in a redundancy memory area is selected instead of the column COL0 in the normal memory area. To make the replacement effective, the replacing information indicating the replacement is recorded in a memory cell corresponding to the column COL0 in a redundancy file memory RFL, which is positioned on the same word line in the redundancy file memory RFL0.

When selecting and driving the word line WL0, therefore, a cell $RMC_{00}$ recording the replacing information in the redundancy file memory area RFL is selected and a replacing data signal S0 indicating the cell should be replaced is output from the redundancy file memory RFL0. The replacing information signal S0 is supplied to a column selecting circuit CS0 to make a column selection signal C0 be an unselective state. At the same time, the replacing information signal S0 is also supplied to a redundancy selecting circuit RCS to make the selection signal RC of the column RCOL in the redundancy memory area selective. Consequently, the column COL0 including a defective cell is replaced into the column RCOL in the redundancy memory area with respect to the word line WL0.

When the defective cell exists in a column COL1 of the normal memory area as shown in an example of FIG. 7, the replacing information indicating the cell is defective is recorded in the memory cell $RMC_{11}$ in the corresponding redundancy file memory RFL1, which is on the same word line WL1. Therefore, when selecting and driving the word line WL1, the memory cell $RMC_{11}$ in the redundancy file memory RFL1 is also selected and the replacing information signal S1 indicating that the cell should be replaced is output from the redundancy file memory RFL1. In response to the replacing information signal S1, the column selecting circuit CS1 inhibits to select the column, and the redundancy selecting circuit RCS permits to select the redundancy column RCOL in the redundancy memory area.

The structure of the redundancy file memory of FIG. 7 makes enable to replace a defective cell in a column into a redundancy column in a redundancy memory area in every word line. Moreover, since the replacing information is read out from the redundancy file memory corresponding to the driven word line when selecting and driving the word line, the signal of replacing information is used to inhibit to select the normal memory area and to permit to select the redundancy memory area. Therefore, even if only one redundancy column is provided in the redundancy memory area, it becomes possible to relieve the defective cell generated in plural columns in the normal memory area. However, when defective cells exist in plural column on the same word line, it is impossible to relieve with the structural example of FIG. 7. However, the word line direction is relatively shorter while the bit line direction is relatively longer in the FeRAM, as described above, so that a possibility of existing plural defective cells in the same word line direction is lower than the case of bit line direction, thus it becomes possible to increase the probability of relieving defective cells sufficiently even with the structure of FIG. 7.

In the redundancy file memory of FIG. 7, the replacing information indicating a defective cell is recorded corresponding to a column for replacement. Therefore, 8-bit memory cells for recording the replacing information must be provided along the word line direction in the redundancy file memory RFL. As the other example, an address of a column having the defective cell can be also recorded in the redundancy file memory. The 8 columns exist in the normal memory area in this case so that the replacing information showing 3-bit address is recorded in the redundancy file memory. This example will be described later.

Figure 8:
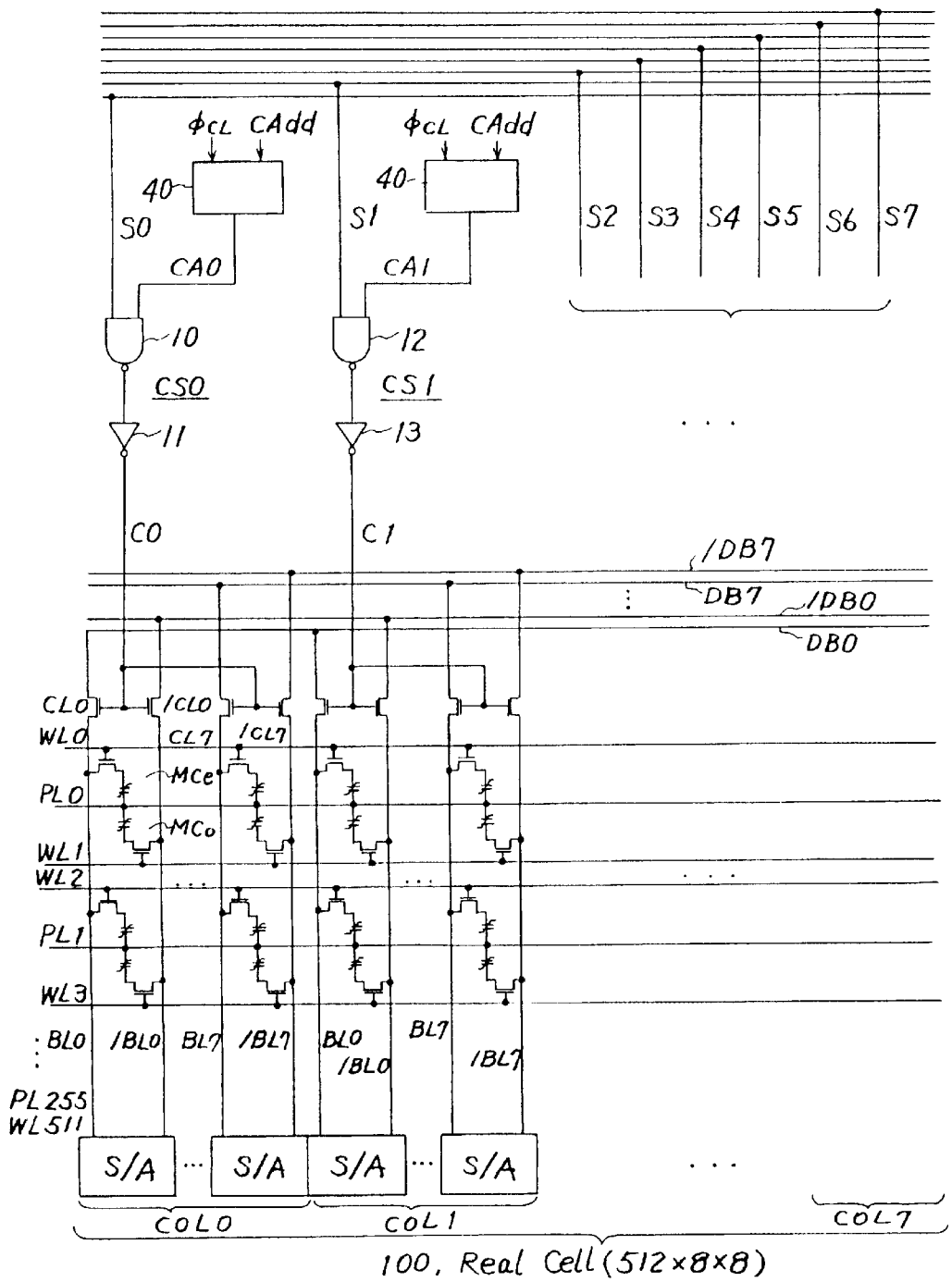
FIG. 8 is a diagram showing a memory device according to the first embodiment.
Figure 9:
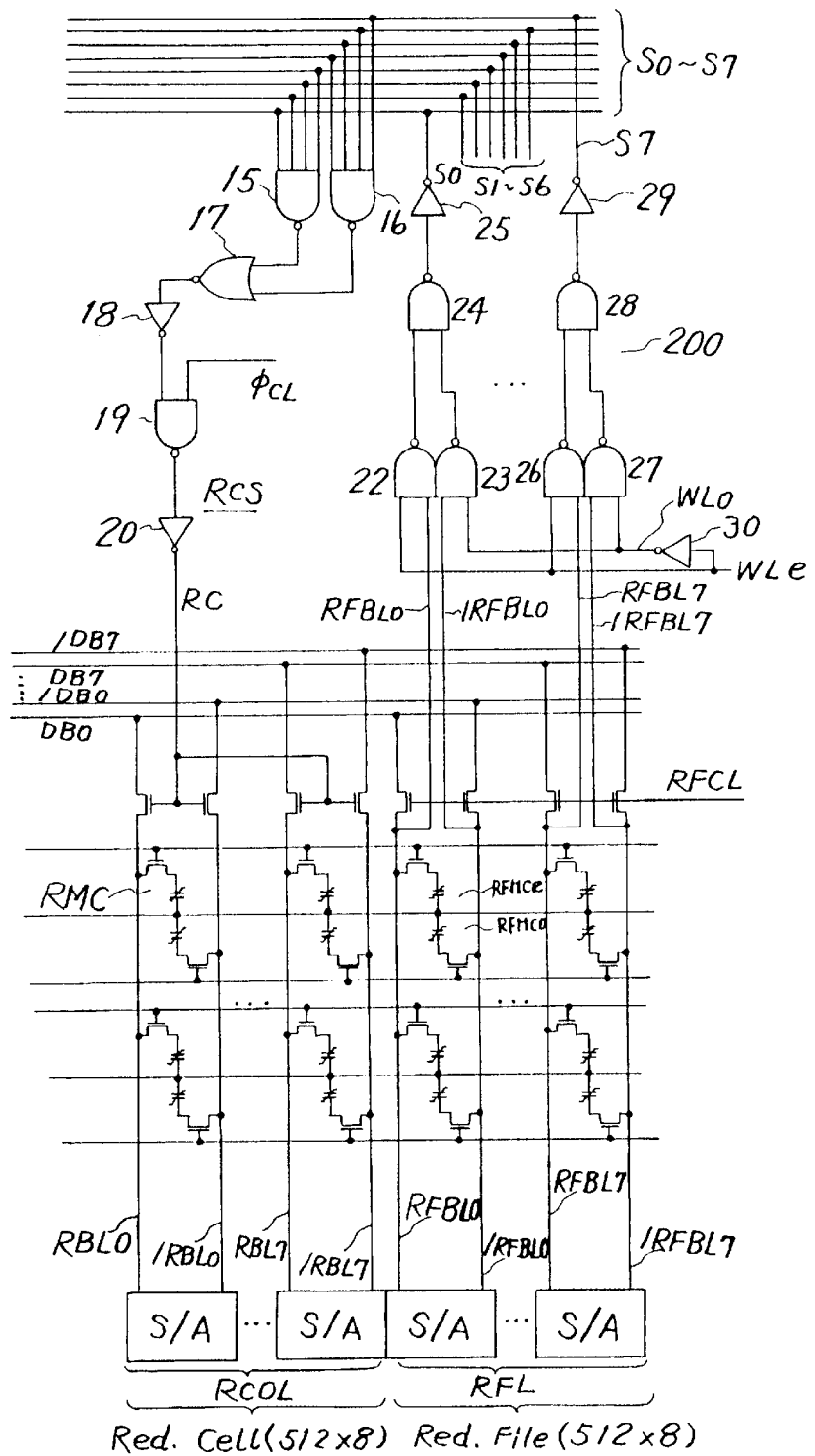
FIG. 9 is a diagram showing a memory device according to the first embodiment.

FIGS. 8 and 9 show a memory device according to the first embodiment of the present invention. FIGS. 8 and 9 respectively show a half-left portion and a half-right portion of the memory device. As shown in FIG. 8, 8 columns COL0 to COL7 shown in FIG. 6 are provided in the normal memory area 100. 8 bit line pairs BL0, /BL0 to BL7, /BL7, 512 word lines WL, and 256 plate lines PL are provided in each column, similarly to the case of FIG. 6. The 8 bit line pairs are connected to the 8 data bus line pairs DB0, /DB0 to DB7, /DB7 through conductive column gates CL0, /CL0 to CL7, /CL7 by each column selection signal C0, C1.

Additionally, column selecting circuits CS0 and CS1 make the column selection signals C0 and C1 be in a selective state, in response to column address selection signals CA0 and CA1 supplied from each column decoder 40, when the replacing information signals S0 and S1 is in non-replaceable state. Specifically, when the column selecting circuit CS0 is used, the column address selection signal CA0 is in H level, which means a selective state, and the replacing information signal S0 is in H level, which means a unreplacable state, the output from a NAND gate 10 becomes L level, the column selective signal C0 becomes H level by an inverter 11, the column gate transistors CL0 and /CL0 become conductive. On the other hand, even if the column address selection signal CA0 is in H level, selective state, if the replacing information signal S0 is in L level, replaceable state, the output of NAND gate 10 becomes H level, the column selective signal C0 becomes L level by the inverter 11, the column gate transistors CL0 and /CL0 become non-conductive, therefore, output or input from or to the column COL0 is inhibited (selection of column).

As shown in FIG. 9, the redundancy column RCOL in the redundancy memory area has the same structure of that of the column in the normal memory area 100. The eight bit line pairs RBL0, /RBL0 to RBL7, /RBL7 of the redundancy column RCOL are connected to eight data bus line pairs DB to /DB7, in response to the redundancy selection signal RC transmitted from the redundancy selecting circuit RCS.

The redundancy file memory RFL also has the same structure of that of the column in the normal memory area 100. These bit lines are connected to the data bus lines through transistors, which becomes conductive in response to a redundancy file memory selection signal RFCL. Thereby, the replacing information is written to the redundancy file memory. Additionally, these bit lines are directly connected to the replacing information signal generator 200.

Even and odd word lines share a plate line in the memory cell area, data sent from the memory cell is output to the left bit line, for example, RFBL0, when the even word line is selected, on the other hand, the data sent from the memory cell is output to the right bit line, for example, /RFBL0, when the odd word line is selected. Therefore, the replacing information signal generator 200 selects the signal from these bit lines with an even word line selection signal WLe, for example, and generates replacing information signals S0 to S7. Therefore, the replacing information signal generator 200 includes NAND gates 22 and 23, a NAND gate 24, and an inverter 25. In the NAND gates 22 and 23, the replacing information signal transmitted from either of bit lines is selected by the even word line selection signal WLe, and the replacing information signal S0 is generated through a circuit composed of the NAND gate 24 and the inverter 25.

Supposing that a cell MCe in the column COL0 in the normal memory area of FIG. 8 is defective, the H level indicating that the cell should be replaced is recorded in the cell RFMCe in the redundancy file memory RFL of FIG. 9. When selecting and driving the word line WL0, then, the H level is read out to the bit line RFBL0, the output from the NAND gate 22 is set to L level by the even word line selecting signal WL3 at H level, and the replacing information signal S0 becomes L level of a replaceable state. The selection of the column COL0 in the normal memory area is inhibited and the selection of the column RCOL in the redundancy memory area is permitted.

In the same way, supposing that a cell $MC_o$, in a column COL0 in the normal memory area of FIG. 8 is defective, the H level indicating that the cell should be replaced is recorded in the cell $RFMC_0$ in the redundancy file memory RFL of FIG. 9 is recorded. When the word line WL1 is selected, then, the even word line selection signal WLe becomes L level, the odd word line selection signal $WL_o$ becomes H level, and the replacing information signal S0 becomes L level that means the replacing state.

If any replacing information signals S0 to S7 are in the L level indicating a replaceable state, the redundancy selecting circuit RCS makes the output of the inverter 18 be H level, the redundancy selection signal RC set to H level, in response to a column signal φCL, and permits to read or write from the redundancy memory by the NAND gates 15 and 16, a NOR gate 17 and an inverter 18. When all of the replacing information signals S0 to S7 are in the H level indicating a non-replaceable state, the output from the inverter 18 becomes L level, the redundancy selection signal RC becomes L level and the redundancy memory is not selected.

As explained above, in the first embodiment, information indicating whether the cell is defective or not is recorded in a memory cell, which is provided according to a column for replacement, in the redundancy file memory RFL. Therefore, when selecting and driving the word line for the normal memory area, the recorded data is read out from the redundancy file memory, so that the replacing information signals S0 to S7 are output based on the recorded information and the defective cell is replaced into a redundancy cell.

Figure 10:
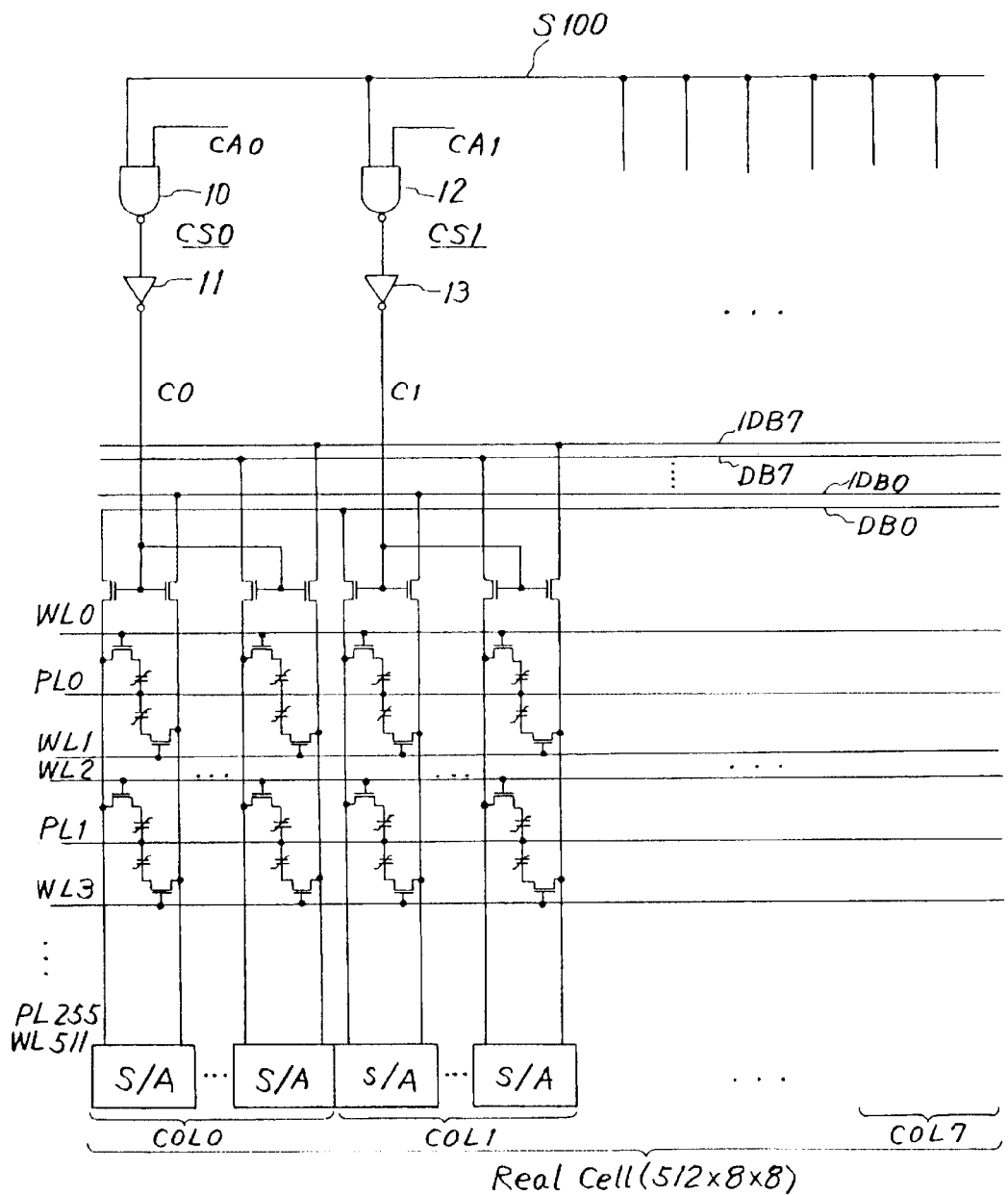
FIG. 10 is a diagram showing a memory device according to the second embodiment.
Figure 11:
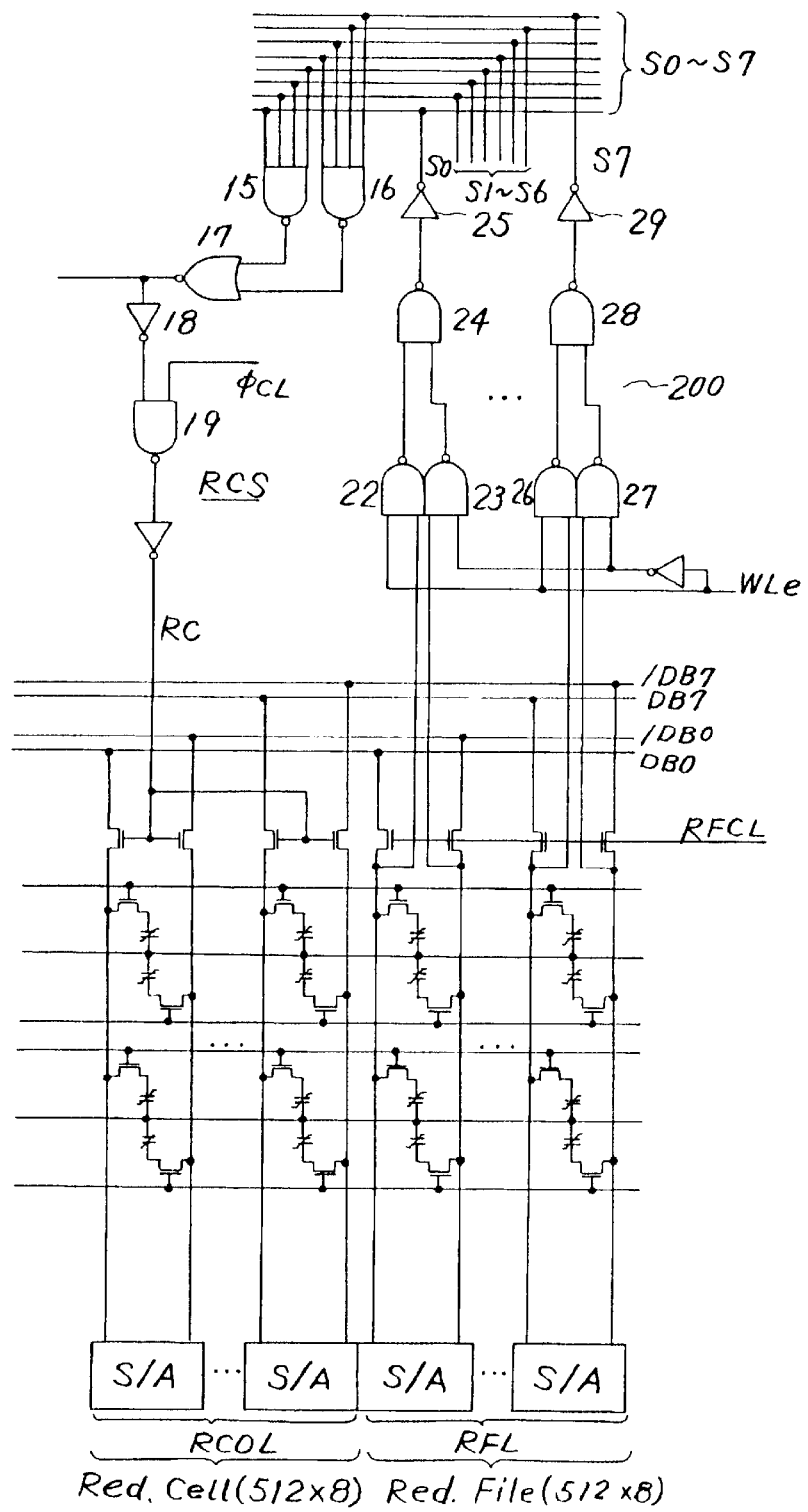
FIG. 11 is a diagram showing a memory device according to the second embodiment.

FIGS. 10 and 11 show circuitry diagrams of a memory device according to the second embodiment. In the same way, the left half portion of the memory device is shown in FIG. 10 and the right half portion of the memory device is shown in FIG. 11. The same reference numbers as those shown in FIGS. 8 and 9 are used in FIGS. 10 and 11

In the second embodiment, a normal memory area, a redundancy memory area and a redundancy file memory area have the same structure of those of the first embodiment. Additionally, replacing information indicating the existence of defective cells is recorded in a memory cell corresponding to the column of the normal memory in a redundancy file memory RFL. Then, the replacing information signal generator 200 generates the corresponding replacing information signals S0 to S7. A different point from the first embodiment, the output from the NOR gate 17 in the redundancy selecting circuit RCS is supplied to column selecting circuits CS0 and CS1 of the normal memory area as a replacing signal S100 bundled of the replacing information signals S0 to S7. In this way, there is no need to place plural replacing information signal lines in the normal memory area by supplying the common replacing signal S100 bundled of replacing information signals, thus that contributes to increase the integration. Other operations in the first embodiment are the same as those of the first embodiments.

Figure 12:
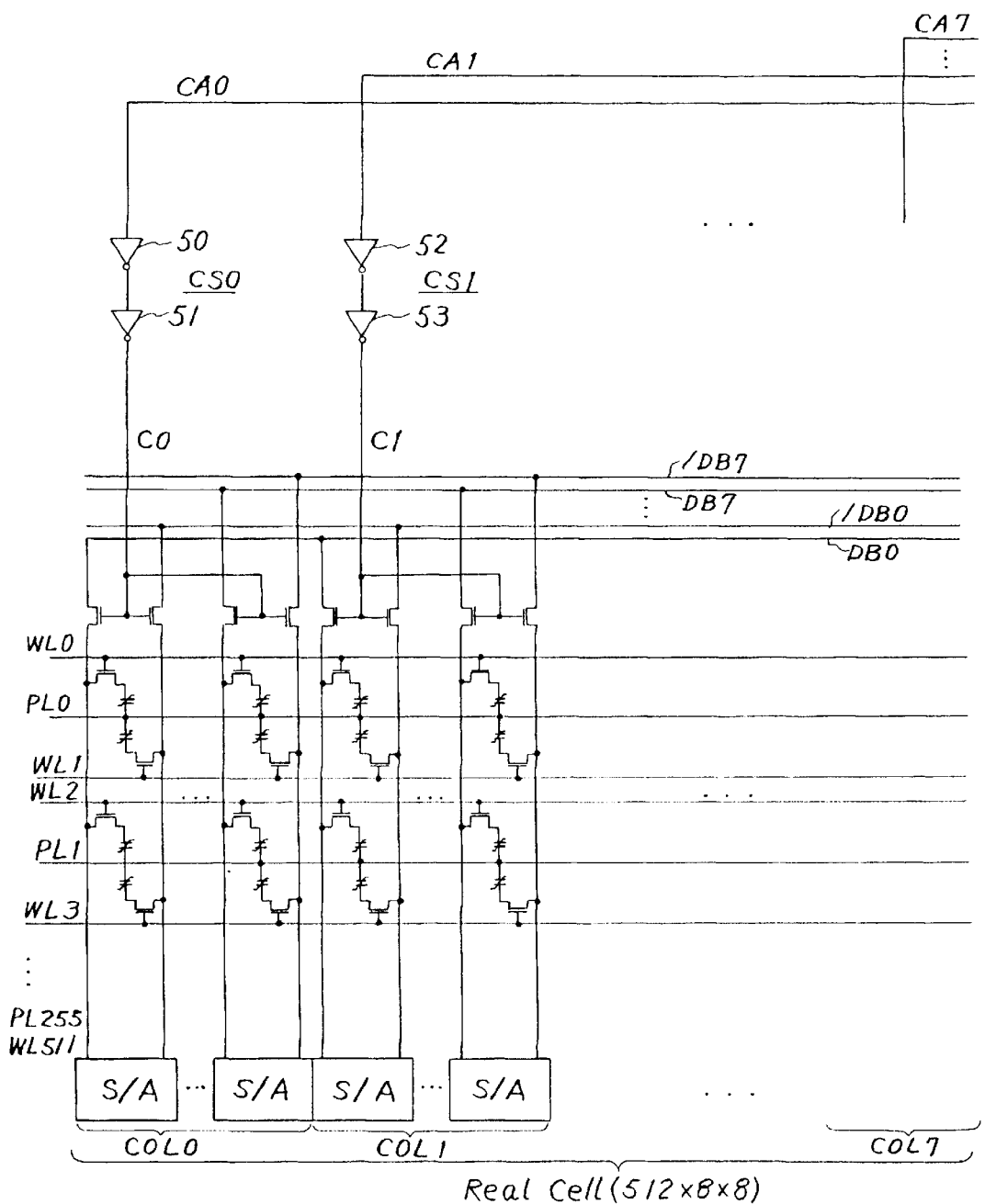
FIG. 12 is a diagram showing a memory device according to the third embodiment.
Figure 13:
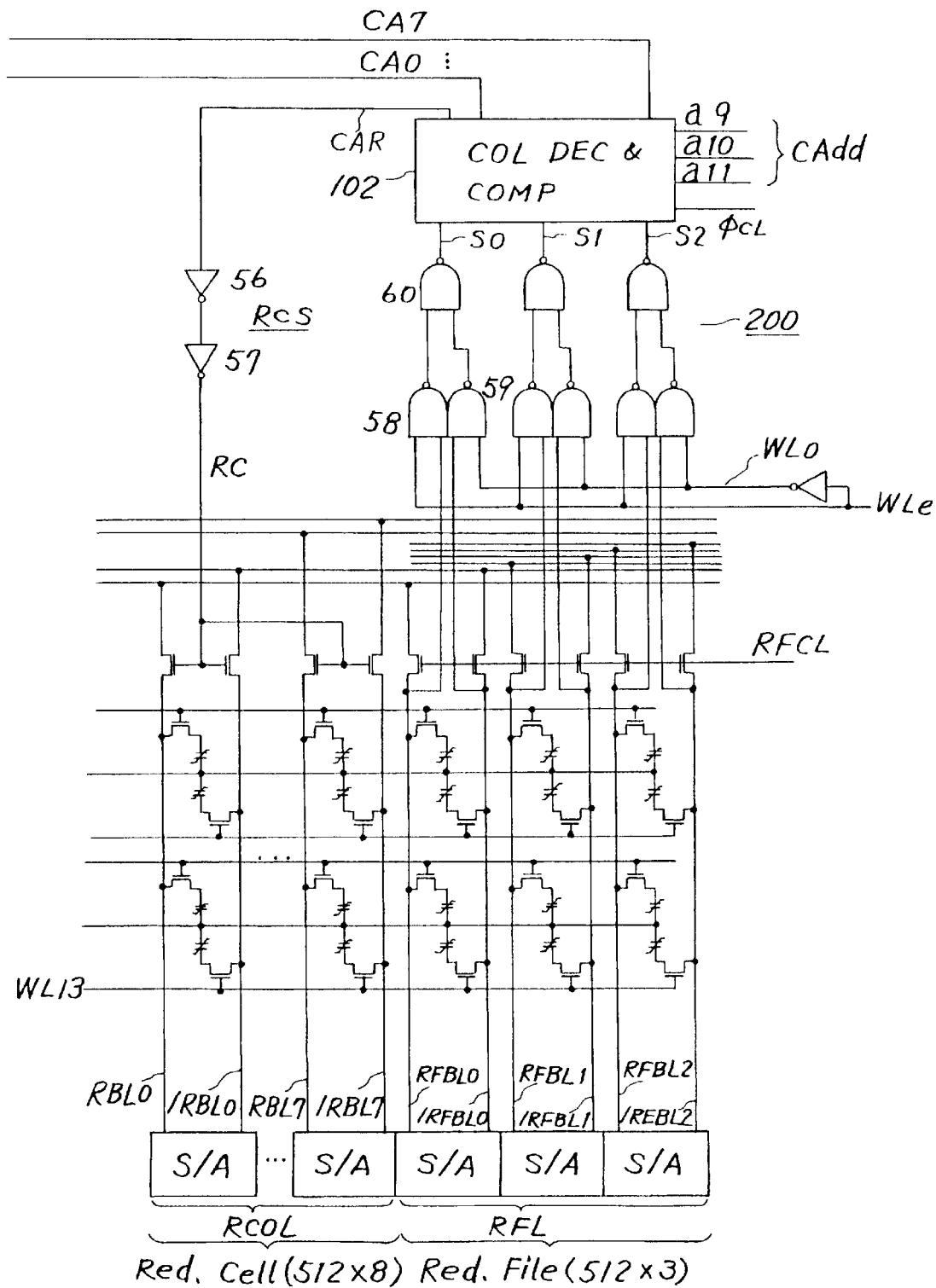
FIG. 13 is a diagram showing a memory device according to the third embodiment.

FIGS. 12 and 13 show a memory device according to the third embodiment. FIGS. 12 and 13 respectively show the left-half portion and the right half-portion of the memory device. In the third embodiment, address information of a column where a defective cell exists is recorded in a redundancy file memory RFL. Therefore, the replacing information indicating whether or not a defective cell exists in a memory cell corresponding to a column of the normal memory area is not recorded as the same as the first and second embodiments. Accordingly, the redundancy file memory RFL composes of 3-bit line pairs, has a smaller capacity than that of the first and second embodiments. In other words, even if the number of columns in the normal memory area becomes larger, there is no need to increase the capacity of the redundancy cell so much.

In the third embodiment, the address information of the column having a defective cell is recorded as replacing information in the redundancy file memory RFL. Therefore, the column address to be replaced is output from the redundancy file memory RFL, according to the selecting and driving operations of the word line. Then, as shown in FIG. 13, a column decoder and comparator 102 are provided in the memory device in the third embodiment. A column address CAdd and a timing signal φCL are supplied to the column decoder and comparator 102, and further, 3-bit replacing address signals S0 to S2 are supplied from the replacing information signal generator 200. In the replacing information signal generator 200, a signal sent from the redundancy file memory corresponding the even and odd word lines is selected. The selecting operation is the same as that of the first embodiment.

The column decoder and comparator 102 compares the column address CAdd with the replacing information signals S0, S1, S2. When the address and the signals are coincident, the redundancy address selecting signal CAR is set to H level, and the redundancy selection signal RC is set to H level as the result, and the redundancy memory RCOL becomes a selective status. Further, all of the column address selection signals CA0 to CA7, which are sent to the normal memory, are set to L level, and all column selection signals C0 to C7 are set to L level so that the access of the normal memory is inhibited. When not coincident, the redundant address selection signal CAR is set to L level, the redundancy selection signal RC is set to L level, thus the access to the redundancy memory RCOL is inhibited. Then, the column decoder and comparator 102 decodes the column address CAdd, sets either of the selected column address selection signals CA0 to CA7 to H level and permits to access to the selected column.

Figure 14:
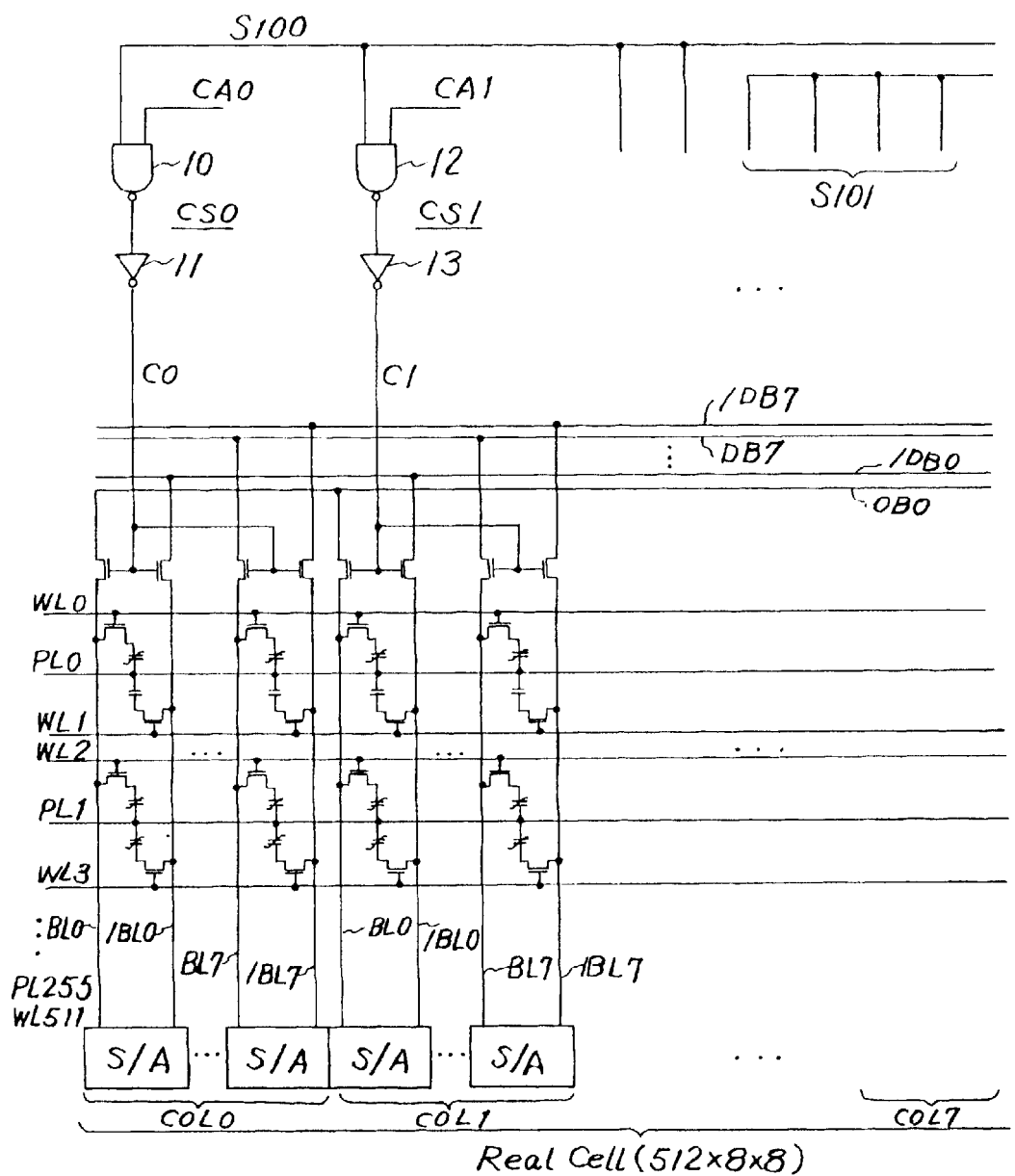
FIG. 14 is a diagram showing a memory device according to the fourth embodiment.
Figure 15:
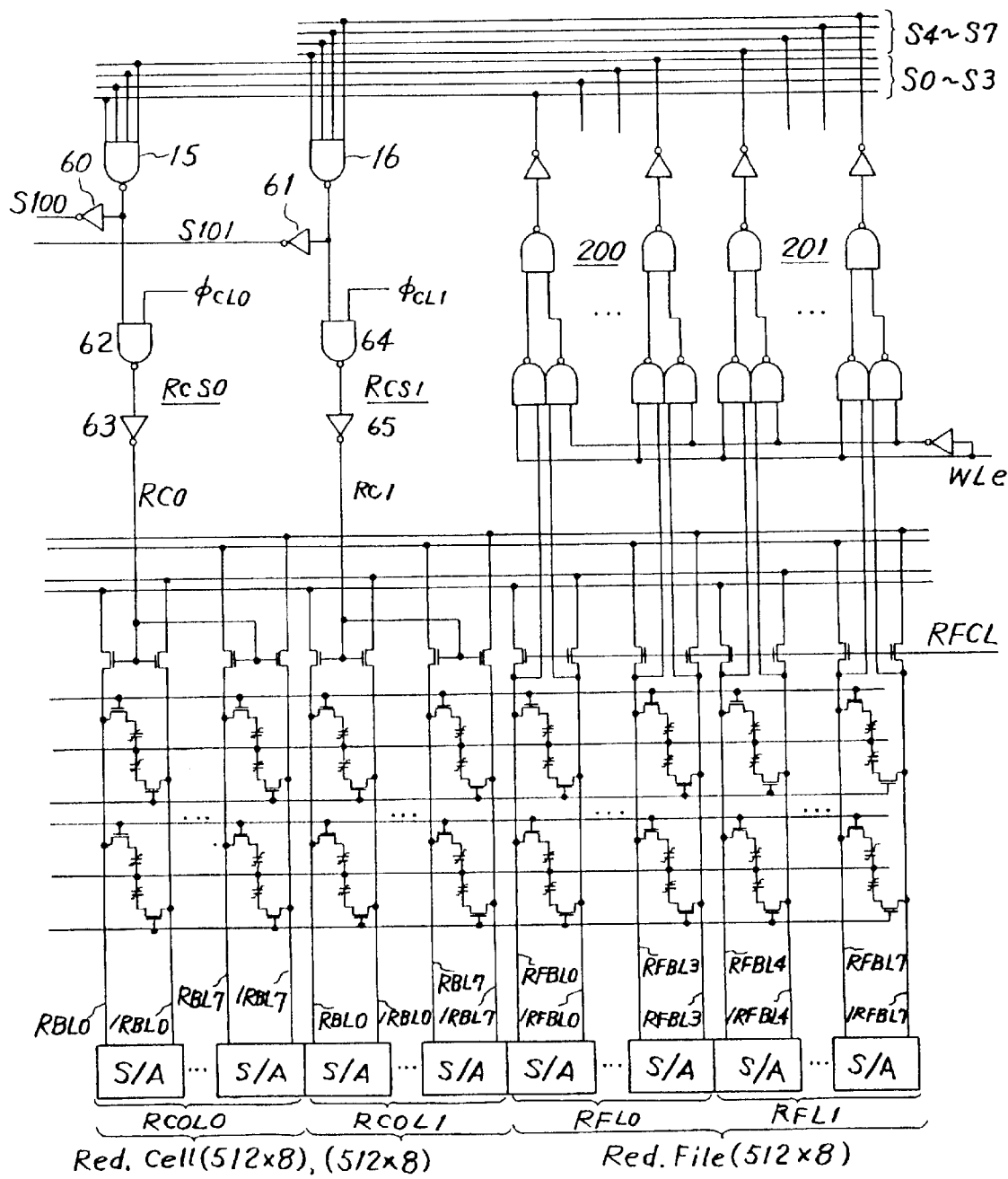
FIG. 15 is a diagram showing a memory device according to the fourth embodiment.

FIGS. 14 and 15 show a memory device according to the fourth embodiment. The redundancy structure of the second embodiment is improved in the fourth embodiment. Although the redundancy memory area has one column in the second embodiment, in the fourth embodiment, two redundancy column RCOL0 and RCOL1 are provided in the redundancy memory area to obtain a higher relieving probability of the defective cells. In other words, the redundancy columns RCOL0 and RCOL1 include 8 bit lines RBL as the same as those of the columns COL0 to COL7 in the normal memory area. Additionally, redundancy selecting circuits RCS0 and RCS1 are provided corresponding to the redundancy columns RCOL0 and RCOL1 to generate each redundancy selection signals RC0 and RC1.

Further, according to the operation in the fourth embodiment, the redundancy file memory area is divided into two redundancy file columns RFL0 and RFL1, and the replacing signal generator is also divided into two generators 200 and 201. The circuitry structure of the generators is the same as those of the first and second embodiments.

In the fourth embodiments, in the same as the first and second embodiments, a memory corresponding to the column for each replacement is also provided in the redundancy file memory area where the existence of the defective cell, i.e. the replacing information for replace or not, is recorded. Therefore, the normal memory area is formed by 8 columns COL0 to COL7, while each of the redundancy file columns RFL0 and RFL1 has 4 bit line pairs RFBL. As the result, the entire redundancy file column, which is divided into two, records the replacing information for each of 8 columns COL0 to COL7.

When the defective cell exists in the columns COL0 to COL3 in the normal memory area, the information is recorded in a memory cell in the redundancy file memory RFL0. If the word line is selected and is driven, as the result, the H level is generated in either of 4 bit line pairs in the redundancy file memory RFL0, the replacing information generator 200 makes either of the replacing information signals S0 to S3 be L level. Then, the output of the NAND gate 15 in the redundancy selecting circuit RCS0 becomes H level, the replacing signal S100, which is an output from the inverter 60, becomes L level to inhibit selecting the columns COL0 to COL3 in the normal memory area. Additionally, the first redundancy selecting circuit RCS0 sets the first redundancy selection signal RC0 to H level and selects the first redundancy column RCOL0, in response to the column timing signal φCL0 according to the H level of the output from the NAND gate 15.

When the defective cell exists in the columns COL4 to COL7 in the normal memory area, the information is recorded in a memory cell in the redundancy file memory RFL1. The operations after that are the same as those of the above-described embodiments, the selection of the columns COL4 to COL7 are inhibited and the selection of the second redundancy column RCOL1 is admitted.

In the fourth embodiment, even when the defective cell exists in the columns COL0 to COL3 and columns COL4 to COL7, each columns are relieved by two redundancy columns RCOL0 and RCOL1, and therefore, the possibility of relieving the defective cell can be increased. Further, in the fourth embodiment, the replacing information signals S0 to S7 may be supplied to the column selecting circuits CS0 to CS7, as they are, instead of the replacing signals S100 and S101, similarly to that of the first embodiment.

Figure 16:
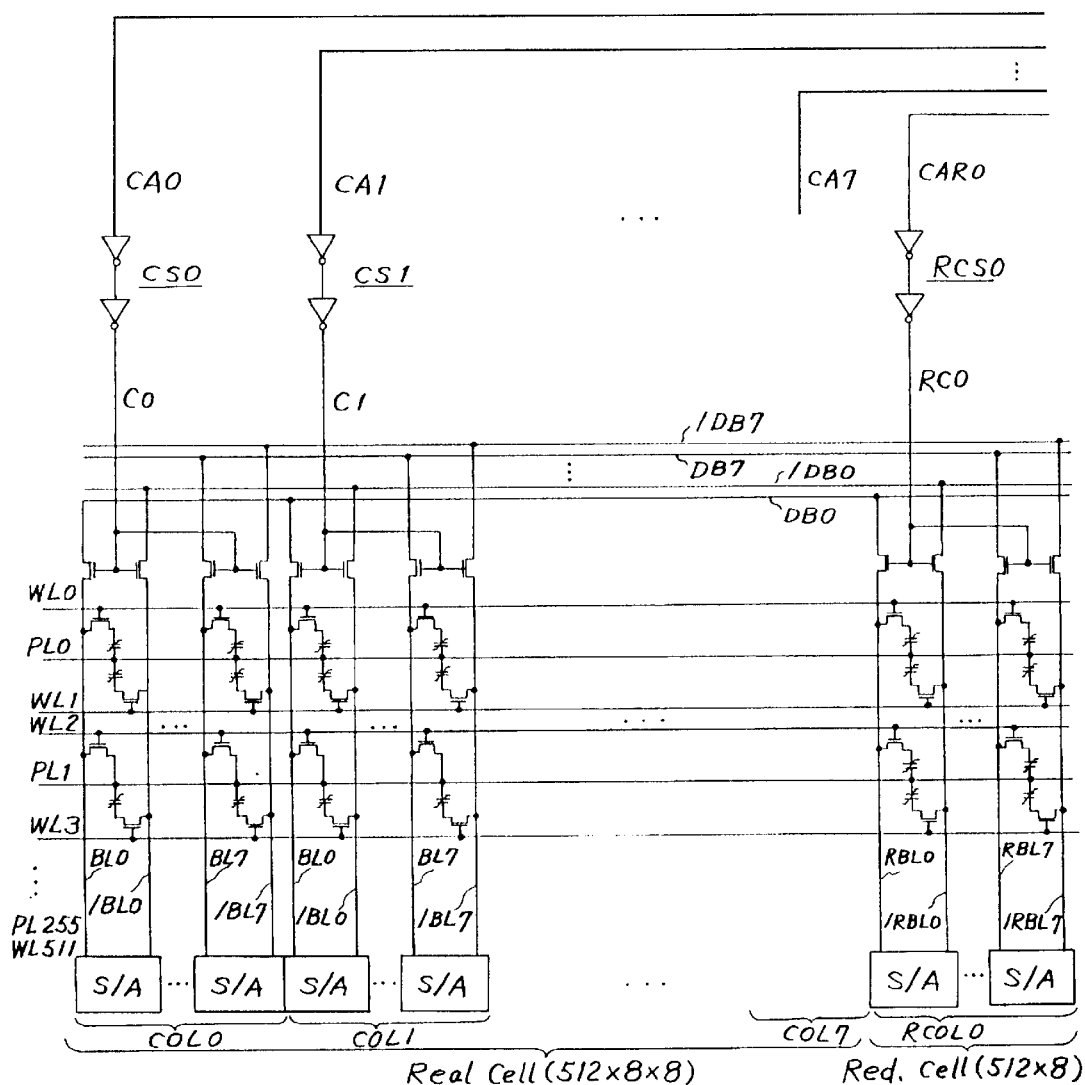
FIG. 16 is a diagram showing a memory device according to the fifth embodiment.
Figure 17:
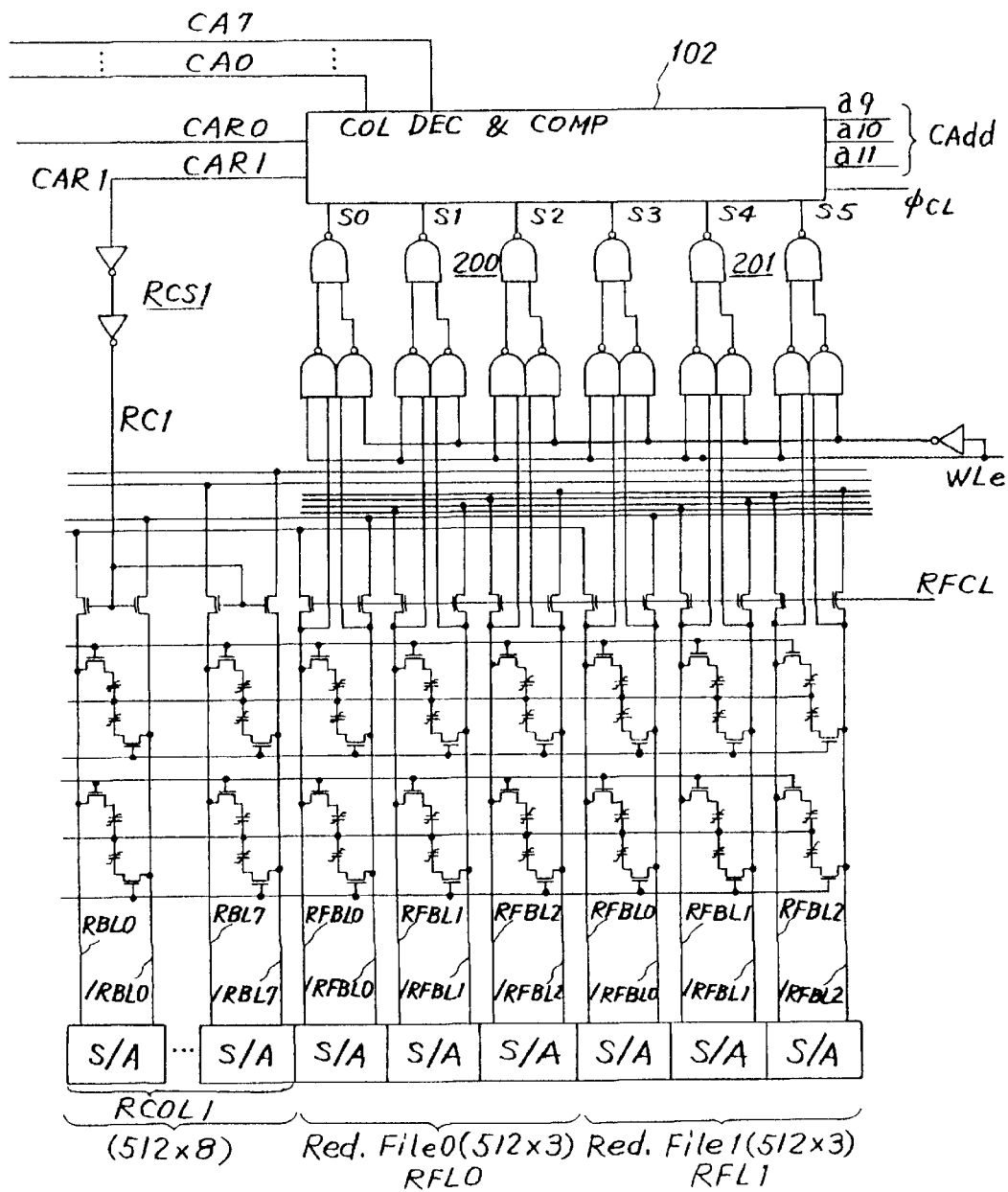
FIG. 17 is a diagram showing a memory device according to the fifth embodiment.

FIGS. 16 and 17 show a memory device according to the fifth embodiment. The memory device according to the fifth embodiment is improved from the third embodiment. In the fifth embodiment, an address of the column where the defective cell exists is recorded in the redundancy file memory. The replaceable redundancy memory including two redundancy columns RCOL0 and RCOL1 can relieve the column having two defective cells in the normal memory area. Similarly, the redundancy file memory also has two redundancy files RFL0 and RFL1 each of which column address of the column having the defective cell is recorded. Therefore, the redundancy files RFL0 and RFL1 respectively has 3 bit line pairs RFBL so as that 3 bit addresses can be recorded.

Both the replacing information signal generators 200 and 201 has the same structures of those of the third embodiment, generate replacing information signals S0 to S2 and S3 o S5 and supply the signals to the column decoder and comparator 102. The column decoder and comparator 102 having the same function of that of the third embodiment compares two sets of replacing information signals S0 to S2 with S3 to S5 with the external column address CAdd. When either of the signals are coincident, the column decoder and comparator 102 sets the column address selection signals CA0 to CA7 to L level to inhibit selecting the columns of the normal memory. Then, the decoder and comparator 102 sets the redundancy column address selection signal CAR0 or CAR1 corresponding to the set of the coincided replacing information signal to H level, and supply the signal CAR0 or CAR1 to the redundancy selection circuit RCS0, RCS1. As a result, the corresponding redundancy selection signal RC0 or RC1 becomes H level, so that either of redundancy columns RCOL0, RCOL1 is selected. Further, when no signal is coincident, the external column address CAdd is decoded and either of the selected column address selecting signals CA0 to CA7 is set to H level to permit the selection of the normal memory column. In this case, thee redundancy selecting circuits RCS0 and RCS1 generate redundancy selection signals RC0 and RC1 at L level, and the selection of the redundancy column is inhibited.

In the fifth embodiment, an address of column where defective cell exists is recorded in redundancy file memories RFL0 and RFL1. Therefore, even if defective cells exist with any combination in eight columns COL0 to COL7, up to two normal columns can be replaced into the redundancy columns RCOL0 and RCOL1. When a defective cell exists in a column COL0, for example, the address "000" is recorded in the redundancy file memory RFL0 and the column COL0 can be replaced into the redundancy column RCOL0. When the defective cell exists in the column COL1, the column COL1 is replaced into the redundancy column RCOL1 by recording the address "001" in the redundancy file memory RFL1. Therefore, in the fifth embodiment, a probability of relieving the defective cell can be larger than that of the third embodiment, and it becomes possible to relieve flexibly the defective cells than the fourth embodiment.

Although a FeRAM is explained in the above-described embodiment as one example, it is preferable to employ the above-described redundancy structure because a word line is relatively shorter and a bit line is relatively longer, as described above. However, the redundancy structure can be employed in a memory device employing floating gate, which is one of the other non-volatile memories. Additionally, the structure can be applied to a DRAM. However, when the DRAM is employed, information of recording a redundancy file memory is volatile, and therefore, it needs to have a structure such as the information is loaded from the other non-volatile memory when a power is ON. Additionally, although a FeRAM having a memory cell structure formed by one transistor and one capacitor in the above-described embodiments, the structure can be applied to a FeRAM having a memory cell structure formed by two transistors and two capacitors as shown in FIG. 4.

In the above described five embodiments, a redundancy file memory for recording information of defective cells to be replaced is formed by a memory cell as the same as a normal and redundancy memory. Thereby, only one type of memory cell is provided, thus it becomes easy to form a memory device in comparison with a system employing a fused ROM or the like. Moreover, as replacing information is electrically recorded to a redundancy file memory, it becomes possible to relieve a defective cell, even after encapsulating a memory chip in a package.

As is explained above, according to the present invention, it becomes possible to simplify a structure of a memory, which records replacing information to a redundancy cell. In addition, it becomes possible to relieve defective cells, even after a memory chip is stored in a package.

What is claimed is:

1. A memory device having a normal memory area and a redundancy memory area, in which a defective cell in the normal memory area can be replaced into a redundancy cell in the redundancy memory area, comprising:

a redundancy file memory for recording a replacing information for the cell to be accessed in the normal memory area, and outputting a signal of the replacing information by being accessed at the same time when the normal memory area is accessed;

a selecting circuit for inhibiting selection of the normal memory area and permitting selection of the redundancy memory area, in response to the signal of the replacing information corresponding to the defective cell.

2. The memory device according to claim 1, wherein the normal memory area, the redundancy memory area and the redundancy file memory include word lines, each of which is concurrently driven, and the signal of the replacing information is output from the redundancy file memory according to the drive of the word line.

3. The memory device according to claim 2, wherein the normal memory area includes plural columns for each replacement, and the redundancy file memory, which is provided corresponding to the plural columns, includes plural cells along the word line for recording the replacing information that indicates whether the cell is replaced or not, the selecting circuit, in response to the signal of the replacing information provided from the plural cells according to the word line drive, inhibits the selection of the corresponding column and permits the selection of the column of the redundancy memory area.

4. The memory device according to claim 2, wherein the normal memory area includes plural columns for each replacement, the redundancy file memory includes plural cells along the word line for recording the replacing information relating to an address of column to be replaced from the plural columns, and the selecting circuit inhibits the selection of the column corresponding to the supplied address and permits the selection of the column in the redundancy memory, when the signal of the replacing information provided from the plural cells according to the drive of the word line is coincident with the supplied address for the plural columns.

5. The memory device according to claim 3 or 4, wherein the column includes plural bit lines.

6. The memory device according to claim 3 or 4, wherein the redundancy memory area includes plural columns for each replacement and the redundancy file memory records plural sets of replacing information.

7. The memory device according to either of claim 1 or 2, wherein cells in the normal memory area, the redundancy memory area and the redundancy file memory are formed by a cell employing a ferroelectric film.

8. The memory device according to either of claim 2, wherein the cell in the normal memory area, the redundancy memory area and the redundancy file memory include a transistor connected to the word line and a capacitor, which is connected to the transistor, having a ferroelectric film.

9. A memory device, in which a defective cell in a normal memory area can be replaced into a redundancy cell in a redundancy memory area, comprising:

a memory area having plural word lines, plural bit lines and plural cells located at cross points between the word lines and the bit lines, wherein the memory area includes the normal memory area, the redundancy memory area and a redundancy file memory area for recording a replacing information of the defective cell, the replacing information of the defective cell connected to a word line is recorded in a cell of the redundancy file memory area connected to the corresponding word line, and the replacing information is output from the redundancy file memory area, in response to the selection of the corresponding word line; and a selecting circuit for inhibiting a selection of the normal memory area and permitting a selection of the redundancy file memory area, in response to the replacing information.

10. The memory device according to claim 9, wherein the normal memory area has plural columns for each replacement, the redundancy file memory area, which is provided corresponding to the plural columns, includes plural cells along the word line for recording the replacing information that indicates whether the cell is replaced or not, and the selecting circuit, in response to the signal of the replacing information provided from the plural cells according to the word line drive, inhibits the selection of the corresponding column and permits the selection of the column of the redundancy memory area.

11. The memory device according to claim 9, wherein the normal memory area includes plural columns for each replacement, the redundancy file memory includes plural cells along the word line for recording the replacing information relating to an address of column to be replaced from the plural columns, and the selecting circuit inhibits the selection of the column corresponding to the supplied address and permits the selection of the column in the redundancy memory, when the signal of the replacing information provided from the plural cells according to the drive of the word line is coincident with the supplied address for the plural columns.

12. The memory device according to claim 10 or 11, wherein the redundancy memory area includes plural columns for each replacement, and the redundancy file memory area records replacing information that indicates plural columns belonging to a common word line are replaced into plural columns in the redundancy memory area.

13. The memory device according to either of claims 9 to 12, wherein each cell in the normal memory area, the redundancy memory area and the redundancy file memory area is formed by a cell having ferroelectric film.

* * * * *